United States Patent
Tseng et al.

(10) Patent No.: US 8,247,705 B2
(45) Date of Patent: Aug. 21, 2012

(54) CIRCUIT SUBSTRATE AND MANUFACTURING METHOD THEREOF

(75) Inventors: Tzyy-Jang Tseng, Hsinchu (TW); Chang-Ming Lee, Taoyuan County (TW); Wen-Fang Liu, Taoyuan County (TW); Cheng-Po Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 316 days.

(21) Appl. No.: 12/718,226

(22) Filed: Mar. 5, 2010

(65) Prior Publication Data
US 2011/0155427 A1 Jun. 30, 2011

(30) Foreign Application Priority Data
Dec. 31, 2009 (TW) .............................. 98146204 A

(51) Int. Cl.
*H05K 1/11* (2006.01)
(52) U.S. Cl. ........ 174/262; 174/250; 174/255; 174/260; 174/261; 174/263; 174/266; 438/622; 438/629; 438/667; 29/830; 29/846; 29/847; 29/852; 428/137
(58) Field of Classification Search .................. 174/250, 174/255, 260–263, 266; 438/622, 629, 667; 29/830, 846, 847, 852; 428/137
See application file for complete search history.

(56) References Cited

FOREIGN PATENT DOCUMENTS

| JP | 2004189981 | 7/2004 |
|----|------------|--------|
| TW | 200723991 | 6/2007 |
| TW | I296436 | 10/2007 |
| TW | I317163 | 10/2007 |
| TW | I294678 | 11/2007 |
| TW | I295842 | 11/2007 |
| TW | I296843 | 11/2007 |

OTHER PUBLICATIONS

"Office Action of Japan Counterpart Application", issued on Feb. 27, 2012, p. 1-p. 6.

*Primary Examiner* — Xiaoliang Chen
(74) *Attorney, Agent, or Firm* — J.C. Patents

(57) ABSTRACT

A manufacturing method of a circuit substrate includes the following steps. A dielectric layer is formed on at least one surface of a substrate. An insulating layer is formed on the dielectric layer. A portion of the insulating layer and a portion of the dielectric layer are removed, so as to form at least one blind via in the dielectric layer and the insulating layer. An electroless plating layer is formed on the sidewall of the blind via and a remaining portion of the insulating layer, wherein the binding strength between the insulating layer and the electroless plating layer is greater than that between the dielectric layer and the electroless plating layer. A patterned conductive layer is plated to cover the electroless plating layer.

19 Claims, 4 Drawing Sheets

CIRCUIT SUBSTRATE AND MANUFACTURING METHOD THEREOF

CROSS-REFERENCE TO RELATED APPLICATION

This application claims the priority benefit of Taiwan application serial no. 98146204, filed on Dec. 31, 2009. The entirety of the above-mentioned patent application is hereby incorporated by reference herein and made a part of this specification.

BACKGROUND OF THE INVENTION

1. Field of Invention

The present invention relates to a circuit substrate and a manufacturing method thereof, and more generally to a circuit substrate and a manufacturing method thereof for enhancing the process performance.

2. Description of Related Art

Currently, a method of fabricating a circuit substrate with fine patterns and high density uses a semi-additive process (SAP) to form a required circuit layer. Semi-additive processes are divided into two groups: Ajinomoto build-up film (ABF) semi-additive process and non-ABF semi-additive process, depending on the characteristics of insulating materials.

A conductive layer can be directly fabricated on an ABF after the surface of the ABF is roughened. Semi-additive steps such as lithography, plating, stripping and etching steps are then performed, so as to form a circuit layer with fine patterns. The production cost is high because the insulating material is limited to be an ABF.

The manufacturing method using a non-ABF includes pressing a thin copper layer on the surface of the non-ABF. Semi-additive steps such as lithography, plating, stripping and etching steps are then performed, so as to form a circuit layer with detailed. The process performance of the method using a non-ABF is lower than that of the method using an ABF because the thin copper layer has poor adhesion to the non-ABF. Accordingly, in the current semi-additive process, when a specific material such as an ABF is used, a plating copper can be formed on the ABF without forming a bottom copper before forming the plating copper. On the other hand, when a non-ABF is used, both bottom copper and plating copper are required to form on the non-ABF.

SUMMARY OF THE INVENTION

The present invention provides a circuit substrate and a manufacturing method thereof for enhancing the process performance.

The present invention provides a circuit substrate and a manufacturing method thereof. The production cost is reduced due to no demand for a specific material such as an ABF.

The present invention provides a manufacturing method of a circuit substrate including the following steps. A dielectric layer is formed on at least one surface of a substrate. An insulating layer is formed on the dielectric layer. A portion of the insulating layer and a portion of the dielectric layer are removed, so as to form at least one blind via in the dielectric layer and the insulating layer. An electroless plating layer is formed on the sidewall of the blind via and a remaining portion of the insulating layer, wherein the binding strength between the insulating layer and the electroless plating layer is greater than that between the dielectric layer and the electroless plating layer. A patterned conductive layer is plated to cover the electroless plating layer.

The present invention provides a circuit substrate including a substrate, a dielectric layer, an insulating layer, an electroless plating layer and a patterned conductive layer. The dielectric layer is disposed on at least one surface of the substrate. The insulating layer is disposed on the dielectric layer. The electroless plating layer covers a portion of the insulating layer and the sidewall of at least one blind via, wherein the blind via is formed in the dielectric layer and the insulating layer, and the binding strength between the insulating layer and the electroless plating layer is greater than that between the dielectric layer and the electroless plating layer. The patterned conductive layer is disposed on the electroless plating layer and in the blind via.

According to an embodiment of the present invention, the dielectric layer includes a thermosetting resin.

According to an embodiment of the present invention, the dielectric layer includes an epoxy resin or a glass-fiber enforced epoxy resin.

According to an embodiment of the present invention, the insulating layer includes a thermoplastic resin.

According to an embodiment of the present invention, the insulating layer includes a polycarbonate resin, a polyester resin or a polyimide resin.

According to an embodiment of the present invention, after the step of forming the insulating layer on the dielectric layer, the manufacturing method further includes performing a surface roughening treatment to the insulating layer.

According to an embodiment of the present invention, the method of forming the insulating layer includes performing a coating process or an inkjet printing process.

According to an embodiment of the present invention, the method of forming the at least one blind via includes performing a laser-drilling process.

According to an embodiment of the present invention, the step of forming the at least one blind via further includes exposing an electrical connection pad disposed below the blind via, and the electrical connection pad is disposed on the surface of the substrate.

According to an embodiment of the present invention, before the step of plating the patterned conductive layer, the manufacturing method further includes forming a patterned photoresist layer on the electroless plating layer.

According to an embodiment of the present invention, after the step of plating the patterned conductive layer, the manufacturing method further includes removing the patterned photoresist layer and the electroless plating layer uncovered by the patterned conductive layer.

According to an embodiment of the present invention, the material of the electroless plating layer is a metal selected from the group consisting of Cu, Ni, Ag, Cr and Sn.

According to an embodiment of the present invention, the patterned conductive layer includes Cu.

According to an embodiment of the present invention, the surface of the substrate has an electrical connection pad thereon, and the patterned conductive layer is electrically connected to the electrical connection pad through the blind via.

In view of the above, in the circuit substrate and the manufacturing method thereof, an insulating layer is formed on a dielectric layer, and an electroless plating layer is then formed on the insulating layer. Since the binding strength between the insulating layer and the electroless plating layer is greater than that between the dielectric layer and the electroless plating layer, the process performance is accordingly enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
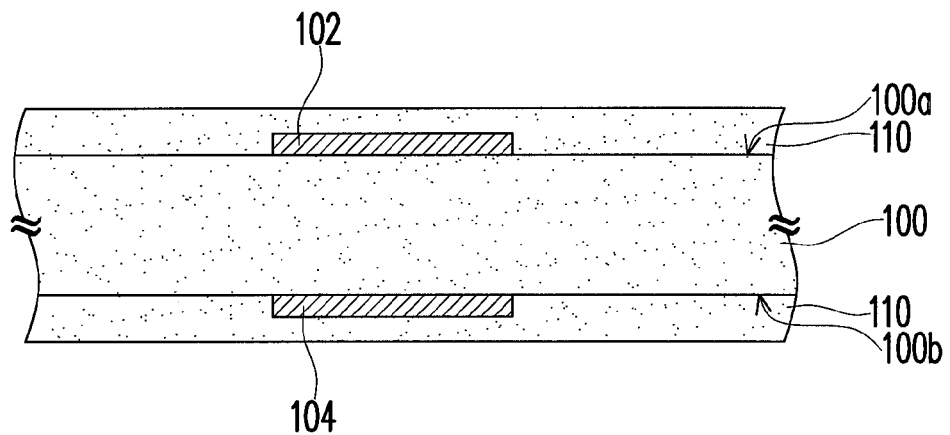
FIGS. 1A to 1F schematically illustrate cross-sectional views of a manufacturing method of a circuit substrate according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F schematically illustrate cross-sectional views of a manufacturing method of a circuit substrate according to an embodiment of the present invention. FIG. 2 schematically illustrates a cross-sectional view of a circuit substrate according to an embodiment of the present invention.

A manufacturing method of a circuit substrate includes the following steps. Referring to FIG. 1A, a dielectric layer 110 is formed on two surfaces 100a and 100b of a substrate 100. The substrate 100 may be a circuit board including a plurality of patterned circuit layers (not shown) and a plurality of patterned dielectric layers (not shown) stacked alternately, or a carrier formed by other insulating materials. The surfaces 100a and 100b of the substrate 100 may respectively have an electrical connection pad 102 and a patterned circuit 104 thereon. The electrical connection pad 102 and the patterned circuit 104 include Cu, for example. The dielectric layer 110 can be a thermosetting resin, for example. A semi-cured prepreg is coated on one surface of the substrate 100 and heated to a hardening temperature, so that the semi-cured prepreg having a fluid-deformation property is hardened to a cured dielectric layer. The dielectric layer 110 can be an epoxy resin or a glass-fiber enforced epoxy resin in an initial liquid state, or an irreversible polymer material in an initial liquid state.

Figure 1B:
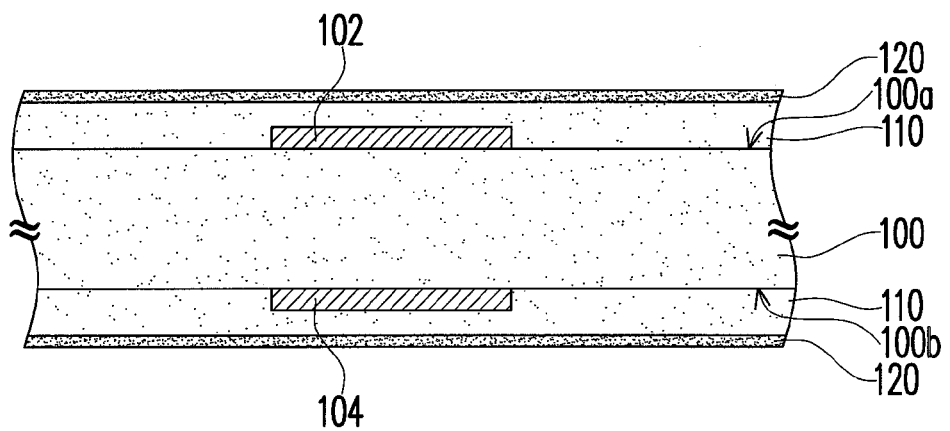
Figure 1C:
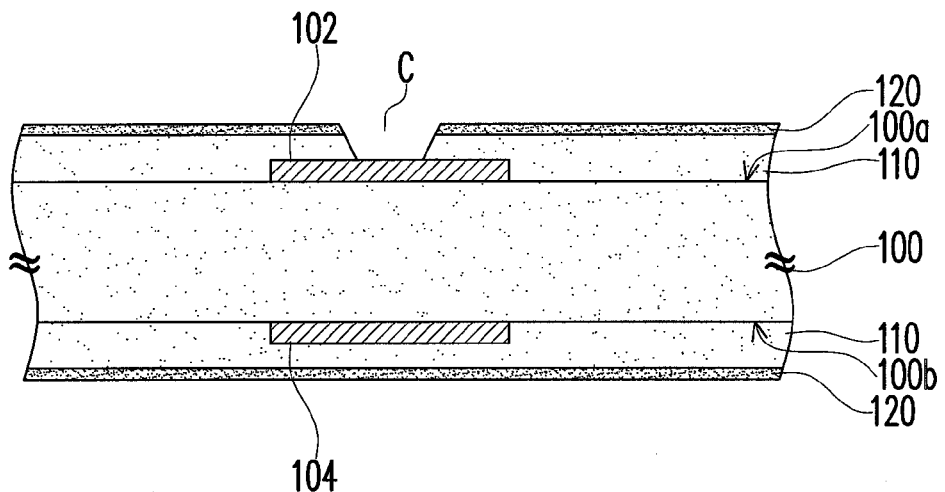
Figure 2:
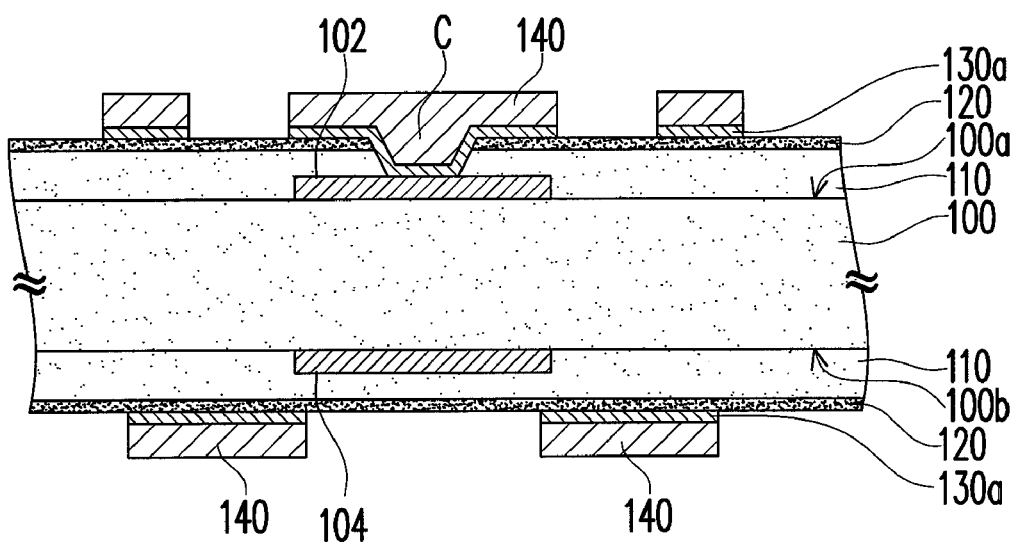
FIG. 2 schematically illustrates a cross-sectional view of a circuit substrate according to an embodiment of the present invention.

Referring to FIGS. 1B and 1C, an insulating layer 120 is formed on the dielectric layer 110. A portion of the insulating layer 120 and a portion of the dielectric layer 110 are removed, so as to form at least one blind via C in the dielectric layer 110 and the insulating layer 120. The insulating layer 120 can be a thermoplastic resin, and the forming method thereof includes performing a coating process or an inkjet printing process, for example. Accordingly, the insulating layer 120 is softened to a liquid-state resin when heated, and hardened to a solid-state resin when cooled. Further, a surface roughening treatment can be performed to the dielectric layer 110 before the insulating layer 120 is formed on the dielectric layer 110, so as to enhance the binding strength between the cured dielectric layer 110 and the insulating layer 120, and thus, a peeling between layers is avoided.

The method of forming the at least one blind via C includes performing a laser-drilling process, for example. A desmear step can be performed after the laser-drilling process, so as to clean the residues in the blind via C. In this embodiment, after the dielectric layer 110 and the insulating layer 120 are opened by the laser, the electrical connection pad 102 disposed below the blind via C is exposed. The insulating layer 120 includes a polycarbonate resin, a polyester resin or a polyimide resin, for example. Alternatively, the insulating layer 120 can be a thermoplastic polymer material, for example. The thermoplastic polymer material is in an initial solid state, melted when heated, and back to the initial state when cooled. Further, a surface roughening treatment can be performed to the insulating layer 120 after the insulating layer 120 is formed on the dielectric layer 110, so as to benefit the following semi-additive process.

Figure 1D:
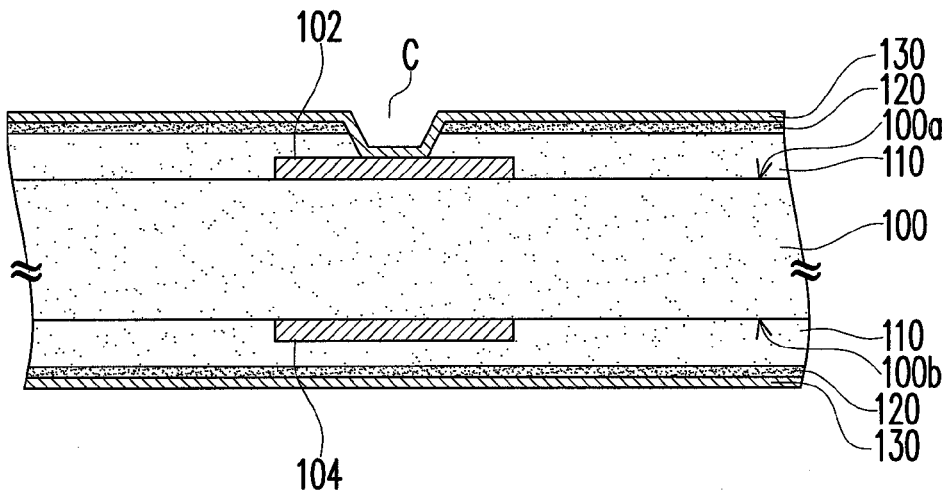
Figure 1E:
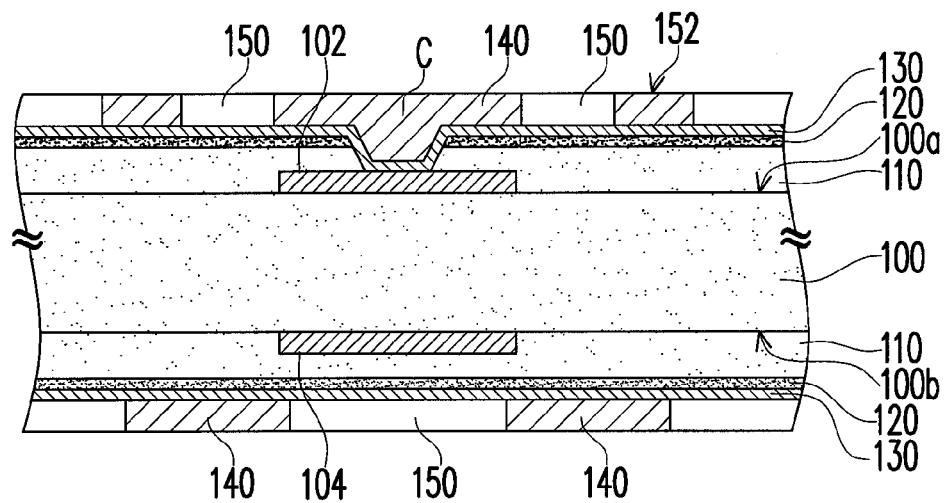

Referring to FIGS. 1D and 1E, an electroless plating layer 130 is formed on the sidewall of the blind via C and the remaining portion of the insulating layer 120. A patterned conductive layer 140 is plated to cover the electroless plating layer 130. It is noted that the insulating layer 120 can be a thermoplastic resin while the dielectric layer 110 can be a thermosetting resin. If the electroless plating layer 130 is directly formed on the dielectric layer 110, the process performance cannot be enhanced due to the poor adhesion of the electroless plating layer 130 to the thermosetting resin. In the present invention, the insulating layer 120 is formed on the dielectric layer 110, and the electroless plating layer 130 is then formed on the insulating layer 120. Since the binding strength between the insulating layer 120 and the electroless plating layer 130 is greater than that between the dielectric layer 110 and the electroless plating layer 130, the process performance is accordingly enhanced. In this embodiment, the material of the electroless plating layer 130 is a metal selected from the group consisting of Cu, Ni, Ag, Cr and Sn, for example. The material of the electroless plating layer 130 is not limited by the present invention.

Besides, before the step of plating the patterned conductive layer 140, a patterned photoresist layer 150 can be formed on the electroless plating layer 130, and a conductive material is then plated on the electroless plating layer 130 uncovered by the patterned photoresist layer 150 (i.e. in the opening 152 of the patterned photoresist layer 150), so as to form the required patterned conductive layer 140. In this embodiment, the patterned conductive layer 140 fills up the blind via C and is electrically connected to the electrical connection pad 102 below the blind via C. The patterned conductive layer 140 includes Cu, for example.

Figure 1F:
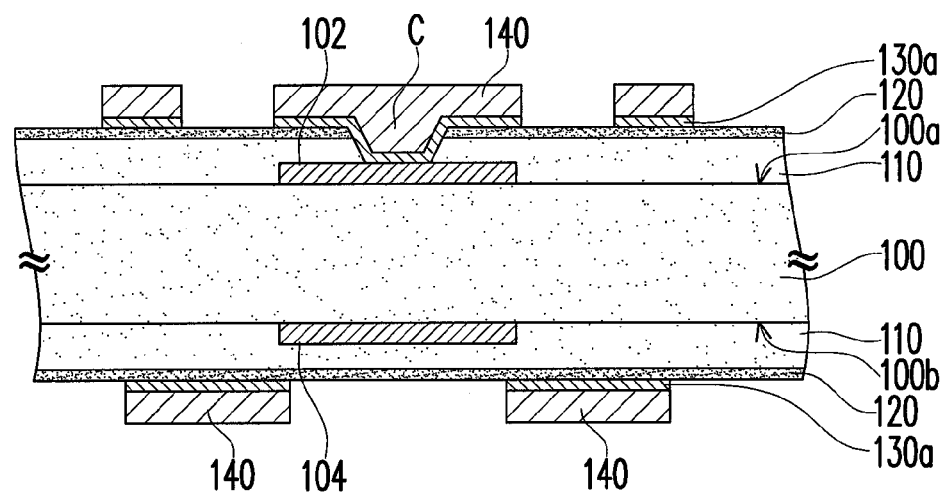

Referring to FIG. 1F, after the step of plating the patterned conductive layer 140, the patterned photoresist layer 150 and the electroless plating layer 130 uncovered by the patterned conducive layer 140 are further removed, so as to form a circuit layer having circuit patterns. The method of removing the electroless plating layer 130 includes performing an etching process, for example. After the etching process, the electroless plating layer 130 is etched to form an electroless plating layer 130a having the same circuit patterns. In the above-mentioned embodiment, two dielectric layers 110, two insulating layers 120 and two electroless plating layers 130 are formed on two surfaces of the substrate 100, and a double-side plating is performed to simultaneously form two patterned conductive layers 140. However, the present invention is not limited thereto. It is appreciated by persons skilled in the art that the above-mentioned process can be performed on single side or double sides of the substrate upon the process requirements.

As shown in FIG. 2, the circuit substrate 10 has a substrate 100, two dielectric layers 110, two insulating layers 120, two electroless plating layers 130a and two patterned conductive layers 140. The two dielectric layers 110 are respectively disposed on two opposite surfaces 100a and 100b of the substrate 100. The two insulating layers 120 are respectively disposed on two dielectric layers 110. The two electroless plating layers 130a cover a portion of the two insulating layers 120 and the sidewall of at least one blind via C, wherein the blind via C is formed in a dielectric layer 110 and the corresponding insulating layer 120. The binding strength between the insulating layer 120 and the electroless plating layer 130a is greater than that between the dielectric layer 110 and the electroless plating layer 130a. The two patterned conductive layers 140 are formed on the two electroless plating layers 130a and in the blind via C, so as to form a circuit layer having circuit patterns. Further, the surface 100a of the substrate 100 has an electrical connection pad 102 thereon, and the corresponding patterned conductive layer 140 is electrically connected to the electrical connection pad 102 through the blind via C. In the above-mentioned embodiment, the circuit substrate 10 has two dielectric layers 110, two insulating layers 120, two electroless plating layers 130a and two patterned conductive layers 140. However, the present invention is not limited thereto. It is appreciated by persons skilled in the art that single-side structure or double-side structure is allowable upon the process requirements.

In summary, in the circuit substrate and the manufacturing method thereof, an insulating layer is formed on a dielectric layer, and an electroless plating layer is then formed on the insulating layer. Since the binding strength between the insulating layer and the electroless plating layer is greater than that between the dielectric layer and the electroless plating layer, the process performance is accordingly enhanced. The insulating material of the present invention is not limited to be an ABF, so that the production cost is reduced. Similarly, after the insulating material of the present invention is roughened, an electroless plating layer can be formed thereon by performing an electroless plating process or an immersion coating process. Semi-additive steps such as lithography, plating, stripping and etching steps are then performed.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A manufacturing method of a circuit substrate, comprising:
    forming a dielectric layer on at least one surface of a substrate;
    forming an insulating layer on the dielectric layer;
    removing a portion of the insulating layer and a portion of the dielectric layer, so as to form at least one blind via in the dielectric layer and the insulating layer;
    forming an electroless plating layer on a sidewall of the blind via and a remaining portion of the insulating layer, wherein a binding strength between the insulating layer and the electroless plating layer is greater than a binding strength between the dielectric layer and the electroless plating layer; and
    plating a patterned conductive layer to cover the electroless plating layer.

2. The manufacturing method of claim 1, wherein the dielectric layer comprises a thermosetting resin.

3. The manufacturing method of claim 2, wherein the dielectric layer comprises an epoxy resin or a glass-fiber enforced epoxy resin.

4. The manufacturing method of claim 1, the insulating layer comprises a thermoplastic resin.

5. The manufacturing method of claim 4, the insulating layer comprises a polycarbonate resin, a polyester resin or a polyimide resin.

6. The manufacturing method of claim 1, further comprising, after the step of forming the insulating layer on the dielectric layer, performing a surface roughening treatment to the insulating layer.

7. The manufacturing method of claim 1, wherein a method of forming the insulating layer comprises performing a coating process or an inkjet printing process.

8. The manufacturing method of claim 1, wherein a method of forming the at least one blind via comprises performing a laser-drilling process.

9. The manufacturing method of claim 1, wherein the step of forming the at least one blind via further comprises exposing an electrical connection pad disposed below the blind via, and the electrical connection pad is disposed on the surface of the substrate.

10. The manufacturing method of claim 1, further comprising, before the step of plating the patterned conductive layer, forming a patterned photoresist layer on the electroless plating layer.

11. The manufacturing method of claim 10, further comprising, after the step of plating the patterned conductive layer, removing the patterned photoresist layer and the electroless plating layer uncovered by the patterned conductive layer.

12. A circuit substrate, comprising:
    a substrate;
    a dielectric layer, disposed on at least one surface of the substrate;
    an insulating layer, disposed on the dielectric layer;
    an electroless plating layer, covering a portion of the insulating layer and a sidewall of at least one blind via, wherein the blind via is formed in the dielectric layer and the insulating layer, and a binding strength between the insulating layer and the electroless plating layer is greater than a binding strength between the dielectric layer and the electroless plating layer; and
    a patterned conductive layer, disposed on the electroless plating layer and in the blind via.

13. The circuit substrate of claim 12, wherein the dielectric layer comprises a thermosetting resin.

14. The circuit substrate of claim 13, wherein the dielectric layer comprises an epoxy resin or a glass-fiber enforced epoxy resin.

15. The circuit substrate of claim 12, the insulating layer comprises a thermoplastic resin.

16. The circuit substrate of claim 15, the insulating layer comprises a polycarbonate resin, a polyester resin or a polyimide resin.

17. The circuit substrate of claim 12, wherein a material of the electroless plating layer is a metal selected from the group consisting of Cu, Ni, Ag, Cr and Sn.

18. The circuit substrate of claim 12, wherein the patterned conductive layer comprises Cu.

19. The circuit substrate of claim 12, wherein a surface of the substrate has an electrical connection pad thereon, and the patterned conductive layer is electrically connected to the electrical connection pad through the blind via.

* * * * *